United States Patent [19]

Minakuchi

[11] 4,379,238
[45] Apr. 5, 1983

[54] INTEGRATED SIGNAL PROCESSING CIRCUIT

[75] Inventor: Hiroshi Minakuchi, Shiga, Japan

[73] Assignee: Matsushita Electric Industrial Co., Ltd., Osaka, Japan

[21] Appl. No.: 352,852

[22] Filed: Feb. 26, 1982

Related U.S. Application Data

[63] Continuation of Ser. No. 51,862, Jun. 25, 1979, abandoned.

[51] Int. Cl.³ .................. H03K 5/00; H03K 17/56
[52] U.S. Cl. ............................... 307/243; 307/445; 307/473; 307/263
[58] Field of Search ............................ 307/240–246, 307/445–473, 262–264

[56] References Cited

U.S. PATENT DOCUMENTS

| | | | |
|---|---|---|---|
| 3,155,845 | 11/1964 | Gruodis et al. | 307/473 |
| 3,156,830 | 11/1964 | Walsh | 307/473 |
| 3,730,994 | 5/1973 | Terry et al. | |
| 3,866,129 | 2/1975 | Cornelissen | 307/262 |

*Primary Examiner*—Stanley D. Miller
*Assistant Examiner*—B. P. Davis
*Attorney, Agent, or Firm*—Stevens, Davis, Miller & Mosher

[57] ABSTRACT

Disclosed is an integrated circuit in which more than two kinds of information outputs are superimposed on the same output terminal and the output level of an output terminal is varied in more than three steps in order to apply many information outputs to a small number of output terminals and transmit the operation state of the internal circuit externally. The structure of the integrated circuit is simplified, because the number of terminals in the integrated circuit and the number of connection wires between internal and external circuits can be reduced.

4 Claims, 11 Drawing Figures

INTEGRATED SIGNAL PROCESSING CIRCUIT

This is a continuation of application Ser. No. 51,862 filed June 25, 1979, now abandoned.

BACKGROUND OF THE INVENTION

1. Field of the Invention

This invention seeks to reduce the number of terminals in an integrated circuit and the number of connection wires for external circuits by transmitting information outputs generated in the integrated circuit to external circuits with use of a reduced number of output terminals, thereby to simplify the constitution of the circuit means.

2. Description of the Prior Art

In a prior art method of transmitting the information outputs generated in an integrated circuit to an external circuit, an information output of only one kind is applied to an output terminal so that the level of one output terminal for a digital information output does not vary by one bit of a binary number. That is, it is so constructed that the level has either H or L level. Depending on the number of units of information transmitted towards the outside, the number of output terminals should be increased.

Another method is a time division method where more than two kinds of information output are applied to a single output terminal. However, since the circuit construction for separating a plurality of information out of a time division output signal becomes complicated, a lot of problems arise.

SUMMARY OF THE INVENTION

This invention seeks to solve the above-mentioned problems, and provide a construction in which more than two kinds of information outputs are superimposed on a single output terminal and an integrated circuit in which the output levels of an output terminal are varied in at least three steps to enable application of information outputs on a small number of output terminals.

The integrated circuit according to this invention is characterized in that, in order to transmit the operation state of an internal circuit to external circuits, a mixing circuit is provided, in which a first output signal varying between at least two d.c. levels is superimposed on a second output signal with a pulse width sufficiently shorter than the period of level variation of the first output signal, transmitting the synthesized signal to a signal output terminal.

DESCRIPTION OF THE PREFERRED EMBODIMENTS

Figure 1:
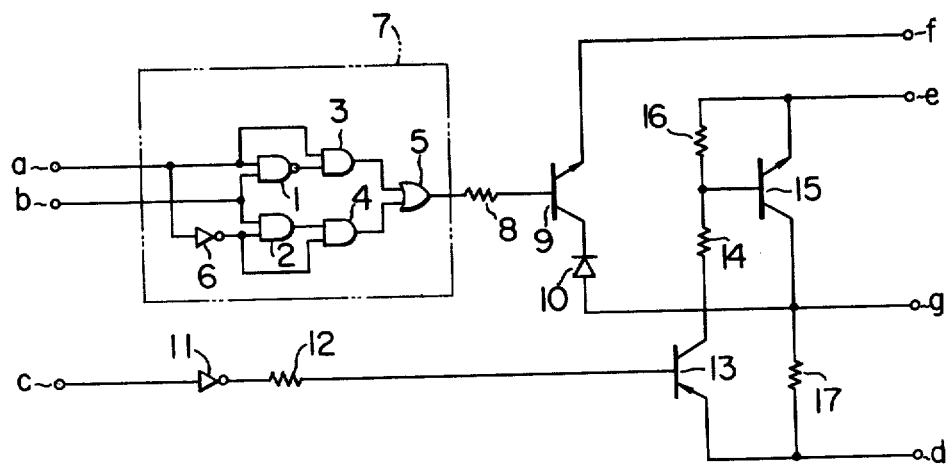
FIG. 1 is a circuit connection diagrams showing a digital signal processing method for an integrated circuit according to one embodiment of this invention.

FIG. 1 shows a circuit connection diagram of a mixing circuit for digital signal processing of an integrated circuit according to one embodiment of this invention. In FIG. 1, terminals a, b and c are first, second and third input terminals respectively, to which digital output signals generated in the integrated circuit are applied. d and e denote plus and minus side power supply terminals respectively. f denotes a voltage division terminal connected to a voltage division point which divides a voltage between the d and e terminals. The voltage division circuit (e.g. a resistor voltage division circuit) for dividing the voltage between the d and e terminals may be contained in the integrated circuit or formed outside the integrated circuit. When the integrated circuit contains a constant voltage circuit, it is convenient to connect the voltage division terminal to an output terminal of such a circuit. g denotes an output terminal for synthesizing three kinds of digital signals as applied at input terminals a, b and c, and for transmitting the signals outward.

In FIG. 1, terminals a, b and c are provided at a tip of the integrated circuit. They do not serve as the terminals for connecting the integrated circuit with an external circuit. The terminals d, e, f and g are practical terminals connected to external connection terminals for the integrated circuit to be connected with an external circuit.

In FIG. 1, the input terminals a and b are connected to the base of an NPN transistor 9 through a resistor 8 and a digital signal mixing circuit 7, which is constructed with a NAND gate 1, and an AND gate 2, an AND gate 3, an AND gate 4, an OR gate 5 and an inverter 6. The emitter of the transistor 9 is connected to a voltage division terminal f, while the collector of the transistor 9 is connected to the output terminal g through a diode 10.

The input terminal c is connected to the base of a PNP transistor 13 through an inverter 11 and a resistor 12. The emitter of the transistor 13 is connected to a plus side power supply terminal d, while the collector of the transistor 13 is connected to the base of an NPN transistor 15 through a resistor 14. The emitter of the transistor 15 is connected to a minus side power supply terminal e, while the collector of the transistor 15 is connected to the output terminal g.

A resistor 16 is connected across the base and the emitter of the transistor 15. A resistor 17 is connected across the output terminal g and a plus side power supply terminal d.

Figure 2:
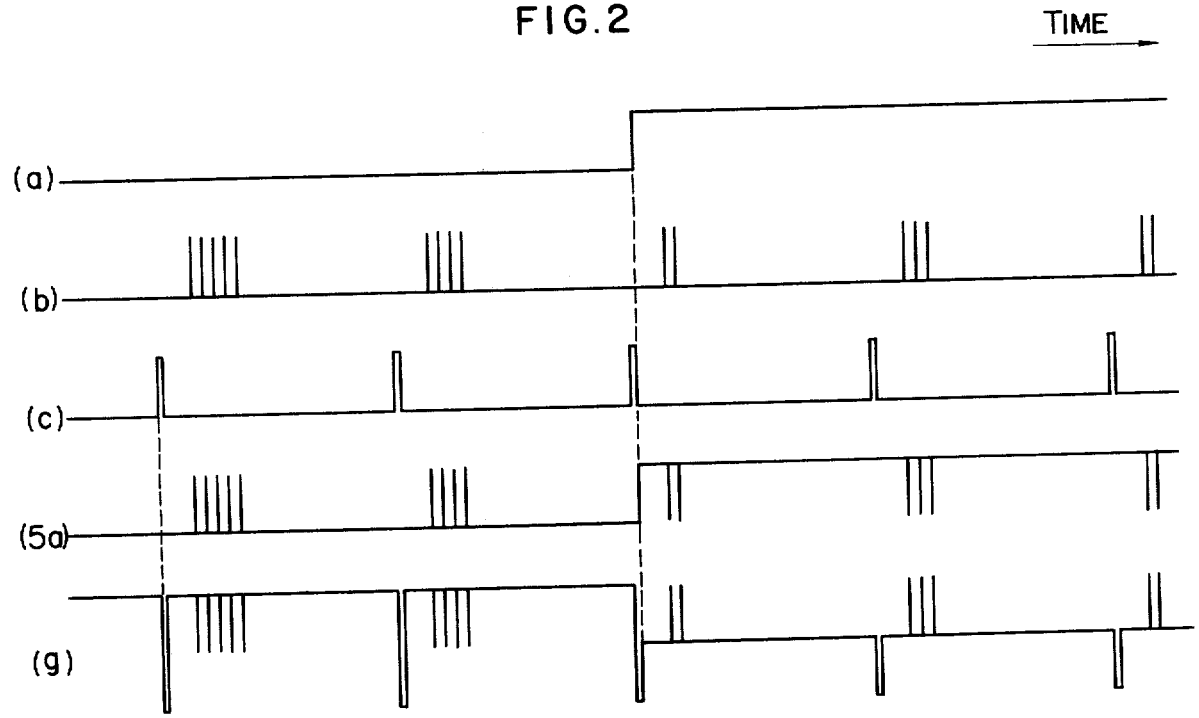
FIg. 2 shows signal wave forms at various sections of the circuit of FIG. 1.

The operation of the above circuit when signal wave forms as shown in FIG. 2 (*a*), (*b*) and (*c*) are applied respectively to the input terminals a, b and c in FIG. 1 will be explained next. (Although not shown in the figure, it is assumed here that the NAND gate 1, the AND gate 2, the AND gate 3, the AND gate 4, the OR gate 5, the inverter 6 and the inverter 11 are supplied with power through the plus side power supply terminal d and the voltage division terminal f. Thus, the H level as used in the following operation is the level of terminal d, the L level is the level of terminal f and the L level is the level of minus side power supply terminal e.) When the level of terminal a is L, the output level of the AND gate 3 becomes L, so that the signal applied at the terminal b does not appear at the output side of the AND gate 3. On the other hand, since the levels of the AND gate 2 and the input terminal of the AND gate on the side of inverter become H, the signal applied at the terminal b appears at the output side of the AND gate 4.

When the level of the terminal a becomes H, the levels of the AND gate 2 and the AND gate 4 on the inverter side become L, so that the signal applied at the terminal b does not appear on the output side of the AND gate 4. But, an inverted signal of the signal at the terminal b appears on the output side of the AND gate 3.

Therefore, when signal wave forms as shown in FIG. 2 (a) and (b) are applied respectively to input terminals a and b of FIG. 1, the output wave form of the OR gate 5 becomes as shown in FIG. 2 (5a).

When a signal wave form as shown in FIG. 2 (c) is applied at the input terminal c of FIG. 1, the transistors 13 and 15 become conductive in the period of H level, and the level of the output terminal g tends to the minimum level L. Furthermore, the transistor 9 becomes conductive in the period of H level in FIG. 2 (5a).

When the signals shown in FIG. 2 (a), (b), and (c) are applied simultaneously at the input terminals a, b and c respectively, the signal wave form appearing at the output terminal g becomes as shown in FIG. 2 (g).

Each signal wave form in FIG. 2 is used for a digital display of the rate of change of the output signal frequency of the integrated circuit having a function of a frequency synthesizer. The signal of FIG. 2 (a) is used to display plus or minus with respect to the central frequency. The signal of FIG. 2 (b) shows count pulses applied at the input side of a counter for displaying the rate of frequency change. The signal of FIG. 2 (c) is used to latch the calculated value of the counter and reset the counter.

The circuit shown in FIG. 1 synthesizes simultaneously three kinds of digital information outputs generated in the integrated circuit at one output terminal. By developing this idea further, more kinds of information output can be synthesized.

In order to synthesize the first output signal applied at the terminal a (Which varies between H and L levels) and the second output signal applied at the terminal b (Which has a pulse width much shorter than the level repetition period of the first output signal), the digital signal mixing circuit 7 as shown in FIG. 1 inverts the phase of the second output signal when the first output signal is H, but passes it without any change when the first output signal is L. It is needless to say that this digital signal mixing circuit 7 can transmit two kinds of information outputs to one output terminal.

Although, in FIG. 1, the AND gate 4 is inserted to make the switching of input signal of the OR gate 5 symmetrical, it is not necessary in a practical circuit construction.

Figure 3:
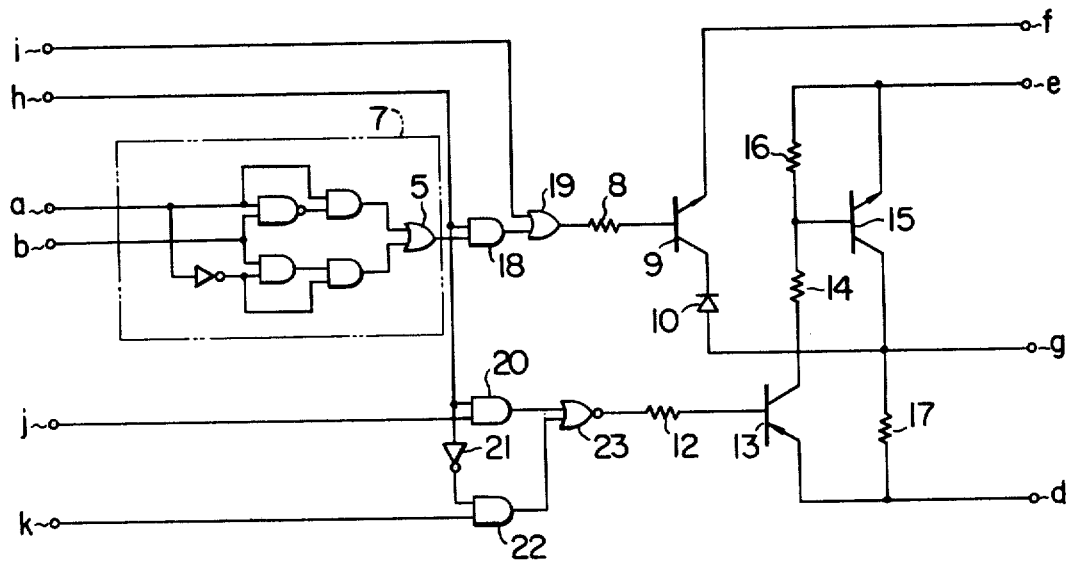
FIGS. 3 and 4 are circuit connection diagrams showing a digital signal processing method for an integrated circuit according to another embodiment of this invention.
Figure 4:
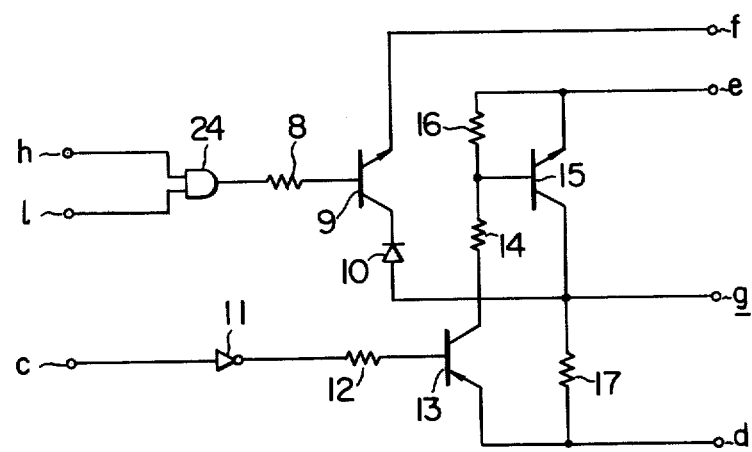

FIGS. 3 and 4 show an example of the application of this invention, in which the frequency synthesizer is used as a reference frequency generation source to superimpose at only two output terminals a lot of information outputs for the identification of the synchronization state in a phase locked loop for rotation control of a rotational body and for display of the rotation speed of the body. In FIG. 3, an output terminal of an OR gate 5 constituting a digital signal mixing circuit 7 is connected to one input terminal of an AND gate 18, the output terminal of the AND gate 18 is connected to one input terminal of an OR gate 19. The output terminal of the OR gate 19 is connected to the base of a transistor 9 through a resistor 8.

A third signal input terminal h is connected to the other input terminal of the AND gate 18, one input terminal of an AND gate 20, and one input terminal of an AND gate 22 through an inverter 21. A fourth signal input terminal i is connected to the other input terminal of the OR gate 19. A fifth signal input terminal j is connected to the other input terminal of the AND gate 20. A sixth signal input terminal k is connected to the other input terminal of the AND gate 22.

Output terminals of the AND gate 20 and the AND gate 22 are connected to two input terminals of a NOR gate 23, the output terminal of which is connected to the base of a transistor 13 through a resistor 12.

In FIG. 3, the digital signal mixing circuit 7, the resistors 8, 12, 14, and 17, the transistors 9, 13 and 15, the diode 10, the input terminals a and b, the plus side power supply terminal d, the minus side power supply terminal e, the voltage division terminal f, and the output terminal g have entirely the same functions as those of the components with like reference numerals in FIG. 1.

In FIG. 4, an input terminal h, a voltage division terminal f, a plus side power supply terminal d, and a minus side power supply terminal e are connected to those terminals with the same reference numeral in FIG. 3. The resistors 8, 12, 14, 16 and 17, transistors 9, 13 and 15, the diode 10 and the inverter 11 have the same functions as those of the components with like reference numerals in FIGS. 1 and 3.

In FIG. 4, the signal input terminal c is connected to the base of the transistor 13 through the inverter 11 and the resistor 12. Input terminals h and l are connected to two input terminals of an AND gate 24, the output terminal of which is connected to the base of the transistor 9 through the resistor 8.

It is assumed in FIGS. 3 and 4 that to the input terminal h is applied a digital signal which becomes H level when the phase locked loop is in the synchronization state; that to the input terminal i is applied a digital signal which becomes H level when the phase locked loop is out of synchronization and the rotation speed of the rotational body becomes slower than a reference value given by the frequency synthesizer; that to the input terminal j is applied a digital signal which becomes H level when the output frequency of the frequency synthesizer becomes equal to the central frequency given preliminarily, (to the input terminal a is given a digital signal which becomes H level when the output frequency of the frequency synthesizer becomes lower than the central frequency given preliminarily); that to the input terminal k is applied a pulse signal having a suitable repetition frequency (of the order of 50 Hz to 10 kHz); and that to the input terminal l is given a frequency division output obtained by applying the count pluse for the input terminal b to a frequency divider as situated in the integrated circuit.

Figure 5:
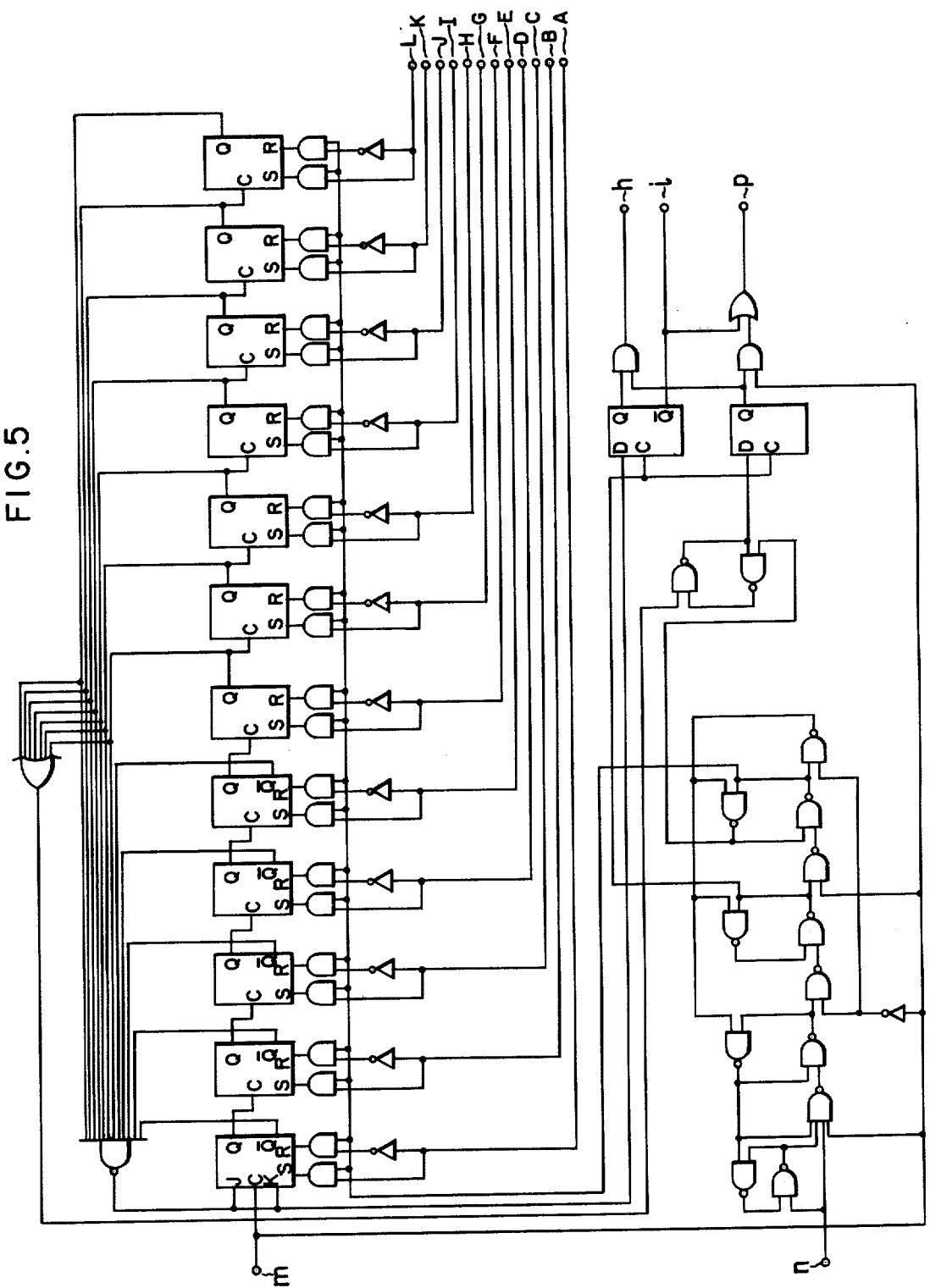
FIG. 5 shows an example of a synchronization pulling-in circuit for forming a digital signal applied to the circuit of FIG. 3.

FIG. 5 shows an example of a synchronization pulling-in circuit used for pulling in the phase locked loop containing a rotational body. A clock signal is applied to an input terminal m, while an output signal of a frequency generator (rotation detector) coupled to the rotational body is applied to an input terminal n. Program signals to be applied to the frequency synthesizer are given to program terminals A to L.

An output terminal P which is a signal output terminal for synchronization pulling-in and output terminals h and i which are signal output terminals for identification of synchronization are connected to corresponding terminals in FIGS. 3 and 4.

Figure 6:
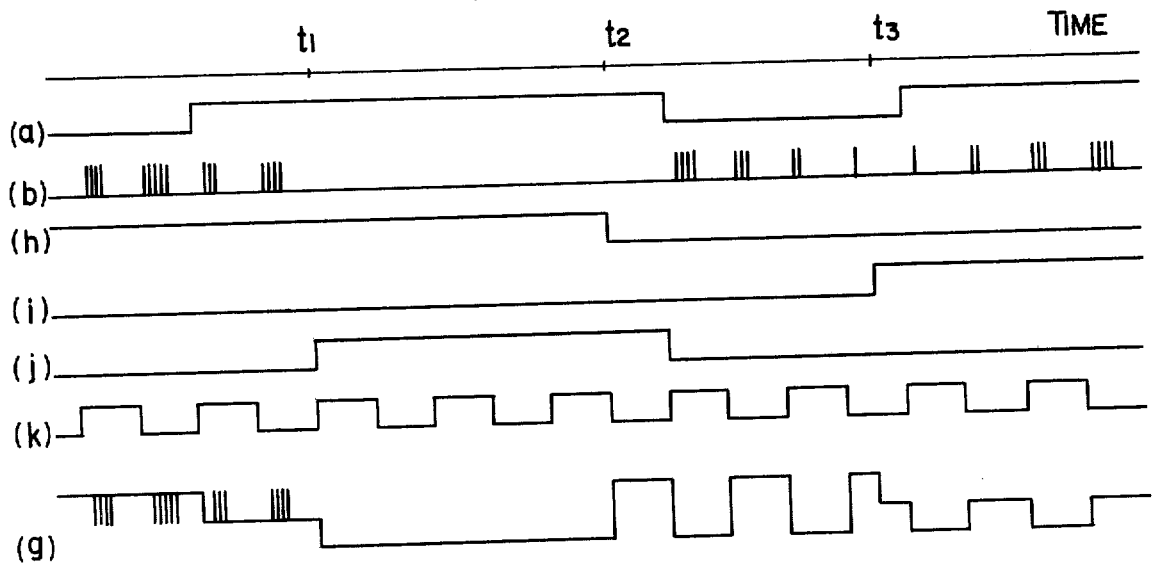
FIG. 6 shows signal wave forms at various sections of the circuit of FIG. 3.

Now, explanation will be made of the operation when digital signals as shown in FIG. 6 (a), (b), (h), (i), (j) and (k) are applied to input terminals a, b, h, i, j and k respectively.

Before a time $t_1$, the output signal wave form appears in the same form as in the case when the level of the input terminal c in the circuit of FIG. 1 is L. When the level of terminal j becomes H at $t_1$, the level of one input terminal of the NOR gate 23 becomes H. Hence, the output level becomes L. As a result, the transistors 13 and 15 become conductive. The diode 10 turns off and the level of the output terminal g drops to the minimum level L.

Without regard to a variation of the signal levels applied to the terminals a, b, i and k, the above state is maintained so long as the both terminals h and i are H.

At a time $t_2$, when the level of the terminal h becomes L, the output levels of AND gates 18 and 20 become L without regard to the levels of the terminals a, b and j. Further, the output levels of OR gate 19 and NOR gate 23 are put under the control of the levels of signals applied at the terminals i and k.

Namely, when the level of terminal i is L, the level of the output terminal g varies between H and L in accordance with a level variation of the terminal k. At a time $t_3$, when the level of the terminal i becomes H, the level of the output terminal g starts to vary between L and L.

It goes without saying that even if the levels of the terminals a, b and j change, the level of the terminal g does not change in connection with this.

As a result, when digital signals as shown in FIG. 6 (a), (b), (h), (i), (j) and (k) are applied at the input terminals a, b, h, i, j and k of FIG. 3, the signal wave form appearing at the output terminal g becomes as shown in FIG. 6 (g).

Figure 7:
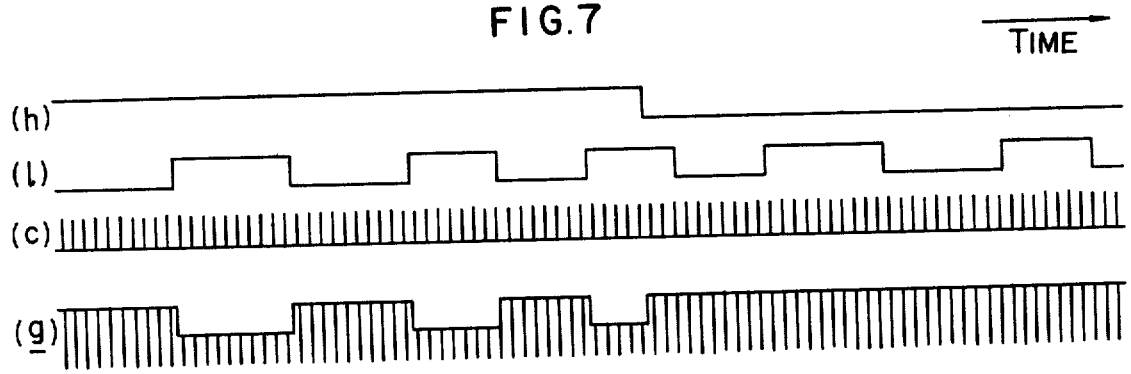
FIG. 7 shows signal wave forms at various sections of the circuit of FIG. 4.

Further, when digital signals as shown in FIG. 7 (h), (l) and (c) are applied at the input terminals h, l and c respectively, the signal wave form appearing at the output terminal g becomes as shown in FIG. 7 (g).

Figure 8:
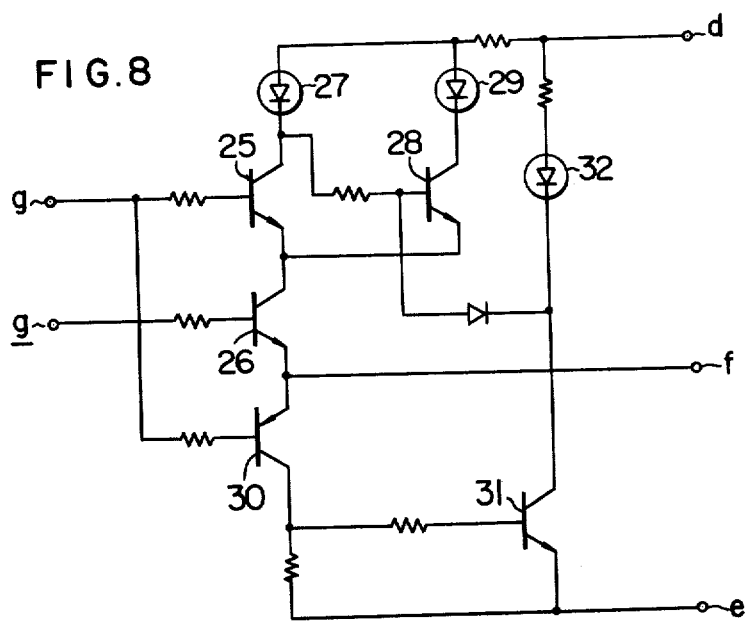
FIGS. 8 and 9 show one example of a display circuit for processing an output signal of an integrated circuit of this invention.
Figure 9:
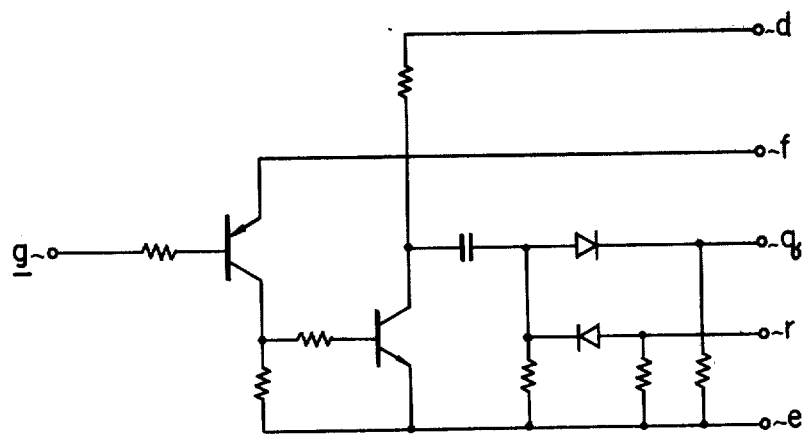

In this manner, the circuit of FIG. 3 superimposes six kinds of digital information outputs at the output terminal g, while the circuit of FIG. 4 superimposes three kinds of digital information outputs at the output terminal g. FIGS. 8 and 9 show examples of cuicuits which demultiplex digital signals appearing at the output terminal and derive necessary information outputs therefrom.

In the circuit shown in FIG. 8, when the levels of input terminals g and g are both H, transistors 25 and 26 become conductive and a light emitting diode 27 for a plus display turns on. When the level of input terminal g is L and the level of input terminal g is H, transistors 26 and 28 become conductive and a light emitting diode 29 for a minus display turns on. When the level of input terminal g is L, transistors 30 and 31 become conductive and a light emitting diode 32 for center display turns on.

Therefore, by applying signal wave forms as shown in FIG. 6 (g) and FIG. 7 (g) to the input terminals g and g of FIG. 8, when the phase locked loop containing a rotational body is in the synchronization state, the light emitting diode 27 for plus display and the light emitting diode 29 for minus display turn on or off, or the light emitting diode 32 for center display turns on with a switching period corresponding to a deflection from the reference frequency of frequency synthesizer.

The rotation speed of the rotational body varies in accordance with a variation of the output frequency of frequency synthesizer. In this case, the variation direction of rotation (plus or minus from the center) and the degree of variation can be identified from the switching state of the light emitting diodes.

Although the wave forms of FIG. 6 (g) and FIG. 7 (g) contain count pulses and reset pulses, this matters little if the pulse width of these pulses is made narrow in the form of impulse or a by-pass condenser is inserted in the circuit of FIG. 8.

Next, we assume that at the time $t_2$ of FIG. 6 the phase locked loop is out of synchronization and the level of terminal g varies between H and L or L and L. In this case, the light emitting diode 27 and the light emitting diode 32, or the light emitting diode 29 and the light emitting diode 32, turn on alternately. If the repetition frequency of pulse signal applied at the terminal k of FIG. 3 is set in the order of 50 Hz to 10 Hz, the two diodes appear to be simultaneously on to the naked eye.

When the rotational body becomes out of synchronization due to overshoot, the light emitting diode 27 for plus display and the light emitting diode 32 for center display turn on simultaneously. When the rotational body becomes out of synchronization due to undershoot, the light emitting diode 29 for minus display and the light emitting diode 32 for center display turn on simultaneously. Therefore, not only the identification of non-synchronization state of phase locked loop but also the identification of overshoot or undershoot of the rotational body can be made possible.

It is also possible to detect electrically a state of overshoot, that is, a state where a current flows through the light emitting diode 27 and the light emitting diode 32 alternately, thereby to constitute a brake circuit for the rotational body.

Figure 10:
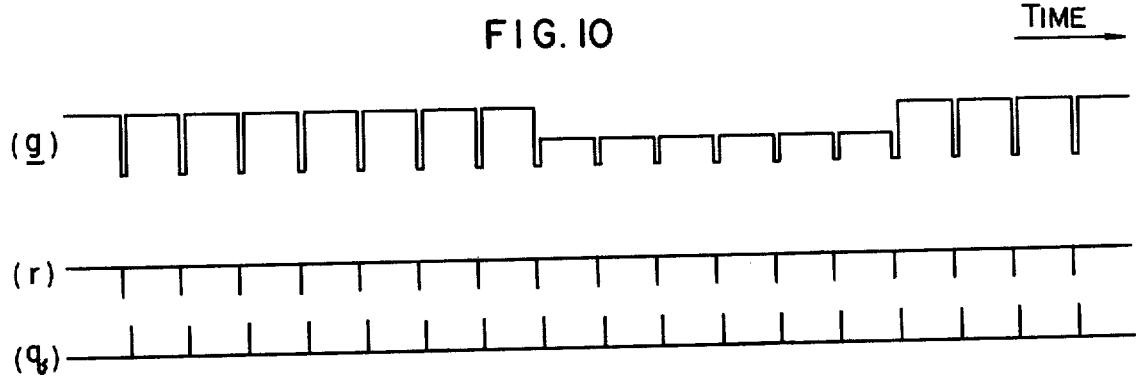
FIG. 10 shows signal wave forms at various sections of the circuit of FIG. 9.

FIG. 9 shows a circuit for generating latch and reset signals for the display counter, in which count pulses contained in the output signal wave form at the terminal g of FIG. 3 are applied to the display counter in order that a deflection from the output frequency of the frequency synthesizer is displayed in the digital form. When a signal wave form as shown in FIG. 10 (g) is applied to the input terminal g (the wave form of FIG. 10 (g) is the same as that shown in FIG. 7 (g) with the time scale enlarged), signal wave form as shown in FIG. 10 (r) and FIG. 10 (g) appear at output terminals r and g respectively, which may be used as latch pulse and reset pulse for the display counter respectively.

As apparent from the foregoing explanations, the integrated circuit of this invention, using such a digital signal mixing circuit 7 such as shown in FIG. 1, superimposes more than two kinds of information outputs generated in the integrated circuit on the same output terminal at the same time (which does not mean any microscopic coincidence but allows a width of the order of one period of a pulse wave form as shown in FIG. 2 (c) in contrast with the so-called time division method). Further, by providing a voltage division terminal at a point between plus side and minus side power supply terminals and varying the signal level of the output terminal between the plus side power supply terminal and the voltage division terminal, between the voltage division terminal and the minus side power supply terminal, or between the plus and minus side power supply terminals, many information outputs can be superimposed. As a result, large effects can be obtained because the number of terminals of the integrated circuit can be sharply reduced.

Figure 11:
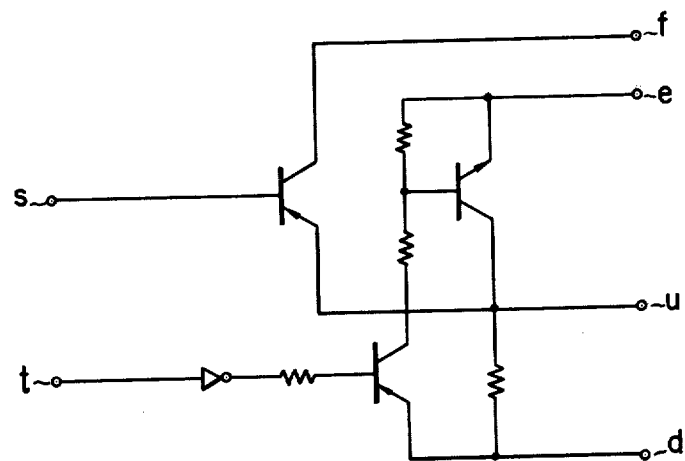
FIG. 11 is a circuit connection diagram showing a further embodiment of this invention.

Although the above embodiments of this invention treated only the case with digital signal outputs, such a circuit as shown in FIG. 11 can also be used where an analog signal varying in the voltage range between a voltage division terminal f and a plus side power supply terminal d is applied to an input terminal s and an impulse like pulse signal (with a pulse width narrow enough not to give any influence on the output level through rectification) is applied to an input terminal t to superimpose the analog signal and the pulse signal with its amplitude in the voltage range between the power supply terminals at an output terminal u.

I claim:

1. An integrated signal processing circuit for transmitting externally a plurality of output signals over a signal output path comprising:
   a first input signal path for receiving a first output signal which varies between at least two D.C. levels;
   a second input signal path for receiving a second output signal having a pulse width shorter than the period of level variation of said first output signal;
   a mixing circuit coupled to said first and second input signal paths for synthesizing a composite output from said first and second output signals, said mixing circuit inverting the phase of said second output signal and transmitting it to said signal output path when said first output signal has a first level and transmitting said second output signal to said signal output path without inversion when said first output signal has a second level, said mixing circuit comprising a first AND gate having input terminals receiving said first output signal and a phase inverted said second output signal, a second AND gate having input terminals receiving a phase inverted first output signal and said second output signal, and an OR gate having input terminals receiving output signals from said first and second AND gates.

2. An integrated signal processing circuit for transmitting externally a plurality of digital information output signals over a signal output path comprising:
   a first input signal path for receiving a first digital information output signal which varies stepwise between two D.C. levels;
   a second input signal path for receiving a second digital information output signal having a pulse width shorter than the period of level variation of said first digital information output signal, and which varies stepwise between said two D.C. levels; and
   a mixing circuit coupled to said first and second input signal paths for synthesizing a composite output signal including said first and second digital information output signals, said mixing circuit including means for transmitting a first D.C. level higher or lower than a voltage division level and a third D.C. level lower or higher than said voltage division level to a signal output terminal in accordance with said digital information output signals, said composite output signal having an envelope which varies between said first and second D.C. levels according to the state of said first digital information output signal and reaching said third D.C. level in response to changes in said second digital information output signal.

3. An integrated signal processing circuit according to claim 2, wherein said mixing circuit comprises:
   a first switching transistor which supplies said signal output terminal with said second D.C. level when said first input signal path has a predetermined signal level applied thereto; and
   a second switching transistor which supplies said signal output terminal with said third D.C. level when said second input signal path has a predetermined signal level applied thereto.

4. An integrated signal processing circuit for transmitting externally a composite output signal including, an analogue information and a digital information over a signal output path comprising:
   a first input signal path for receiving an analogue information output signal which varies between two D.C. levels;
   a second input signal path for receiving a digital information output signal which varies stepwise between said two D.C. levels; and
   a mixing circuit coupled to said first and second input signal paths for synthesizing said composite output signal, said mixing circuit comprising, a first transistor which supplies said signal output terminal with said analogue information output signal, and a second switching transistor which supplies said signal output terminal with a third D.C. level when said second input signal path has a predetermined signal level applied thereto, said composite output signal having a first portion which varies between said two D.C. levels in accordance with said analogue information output signal and a second portion which reaches said third D.C. level when said digital information output signal has said predetermined signal level.

* * * * *